(12) United States Patent
Lee et al.

(10) Patent No.: US 10,773,951 B2
(45) Date of Patent: Sep. 15, 2020

(54) CMOS-MEMS INTEGRATED DEVICE WITHOUT STANDOFF IN MEMS

(71) Applicant: InvenSense, Inc., San Jose, CA (US)

(72) Inventors: Daesung Lee, San Jose, CA (US); Jeff Chunchieh Huang, Fremont, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/366,672

(22) Filed: Mar. 27, 2019

(65) Prior Publication Data

US 2019/0382258 A1 Dec. 19, 2019

Related U.S. Application Data

(60) Provisional application No. 62/687,211, filed on Jun. 19, 2018.

(51) Int. Cl.
*B81B 7/00* (2006.01)
*B81C 1/00* (2006.01)

(52) U.S. Cl.
CPC .......... *B81B 7/007* (2013.01); *B81B 7/0038* (2013.01); *B81B 7/0064* (2013.01); *B81C 1/00238* (2013.01); *B81C 1/00285* (2013.01); *B81C 1/00301* (2013.01); *B81B 2201/0235* (2013.01); *B81B 2201/0242* (2013.01); *B81B 2201/0264* (2013.01); *B81B 2203/04* (2013.01); *B81B 2207/012* (2013.01); *B81C 2203/035* (2013.01); *B81C 2203/0792* (2013.01)

(58) Field of Classification Search
CPC ................ B81B 7/007; B81B 2203/04; B81B 2207/012
See application file for complete search history.

(56) References Cited

U.S. PATENT DOCUMENTS

| | | | |
|---|---|---|---|
| 9,540,228 B2 | 1/2017 | Smeys et al. | |
| 10,081,539 B2 | 9/2018 | Lee et al. | |
| 2016/0221819 A1 | 8/2016 | Smeys et al. | |
| 2017/0297911 A1 | 10/2017 | Shin et al. | |
| 2018/0016135 A1* | 1/2018 | Lee | B81C 1/00238 |

* cited by examiner

*Primary Examiner* — Daniel P Shook

(57) ABSTRACT

An apparatus includes a MEMS wafer with a device layer and a handle substrate bonded to the device layer. The apparatus also includes a CMOS wafer including an oxide layer, and a passivation layer overlying the oxide layer. A bonding electrode overlies the passivation layer and a bump stop electrode overlies the passivation layer. A eutectic bond is between a first bonding metal on the bonding electrode and a second bonding metal on the MEMS wafer. A sensing electrode is positioned adjacent to the bump stop electrode and the bonding electrode. A sensing gap is positioned between the sensing electrode and the device layer, wherein the sensing gap is greater than a bump stop gap positioned between the bump stop electrode and the device layer.

20 Claims, 19 Drawing Sheets

1300

```
┌─────────────────────────────────────────────────────────┐
│  FORMING A MEMS WAFER INCLUDING A DEVICE LAYER AND A    │
│    HANDLE SUBSTRATE BONDED TO THE DEVICE LAYER          │
│                         1302                            │
└─────────────────────────────────────────────────────────┘
                              │
                              ▼
┌─────────────────────────────────────────────────────────┐
│  FORMING A CMOS WAFER INCLUDING AN OXIDE LAYER, AND A   │
│       PASSIVATION LAYER OVERLYING THE OXIDE LAYER       │
│                         1304                            │
└─────────────────────────────────────────────────────────┘
                              │
                              ▼
┌─────────────────────────────────────────────────────────┐
│  FORMING A BONDING ELECTRODE OVERLYING THE PASSIVATION  │
│ LAYER AND A BUMP STOP ELECTRODE OVERLYING THE PASSIVATION│
│                         LAYER                           │
│                         1306                            │
└─────────────────────────────────────────────────────────┘
                              │
                              ▼
┌─────────────────────────────────────────────────────────┐
│  ETCHING THE PASSIVATION LAYER AND THE OXIDE LAYER,     │
│  WHEREIN THE ETCHING EXPOSES A SENSING ELECTRODE        │
│  POSITIONED BETWEEN THE BUMP STOP ELECTRODE AND THE     │
│                  BONDING ELECTRODE                      │
│                         1308                            │
└─────────────────────────────────────────────────────────┘
                              │
                              ▼
┌─────────────────────────────────────────────────────────┐
│   EUTECTICLY BONDING THE MEMS WAFER TO THE CMOS WAFER,  │
│    WHEREIN THE EUTECTICLY BONDING INCLUDES FORMING A    │
│     EUTECTIC BOND BETWEEN A FIRST BONDING METAL ON THE  │
│   BONDING ELECTRODE AND A SECOND BONDING METAL ON THE   │
│  MEMS WAFER, THE EUTECTICLY BONDING FORMS A SENSING GAP │
│   BETWEEN THE SENSING ELECTRODE AND THE DEVICE LAYER,   │
│  AND THE SENSING GAP IS GREATER THAN A BUMP STOP GAP    │
│  POSITIONED BETWEEN THE BUMP STOP ELECTRODE AND THE     │
│                      DEVICE LAYER                       │
│                         1310                            │
└─────────────────────────────────────────────────────────┘
```

FIG. 13

CMOS-MEMS INTEGRATED DEVICE WITHOUT STANDOFF IN MEMS

CROSS-REFERENCE TO RELATED APPLICATIONS

This application claims the benefit of U.S. Provisional Patent Application Ser. No. 62/687,211 filed Jun. 19, 2018, entitled "CMOS MEMS INTEGRATED DEVICE WITHOUT STANDOFF IN MEMS".

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. As technology advances, it is desirable to reduce the size of the MEMS devices, thereby resulting in die size reduction.

SUMMARY

Provided herein is an apparatus including a MEMS wafer with a device layer and a handle substrate bonded to the device layer. The apparatus also includes a complementary metal-oxide semiconductor ("CMOS") wafer including an oxide layer, and a passivation layer overlying the oxide layer. A bonding electrode overlies the passivation layer and a bump stop electrode overlies the passivation layer. A eutectic bond is between a first bonding metal on the bonding electrode and a second bonding metal on the MEMS wafer. A sensing electrode is positioned adjacent to the bump stop electrode and the bonding electrode. A sensing gap is positioned between the sensing electrode and the device layer, wherein the sensing gap is greater than a bump stop gap positioned between the bump stop electrode and the device layer. These and other features and advantages will be apparent from a reading of the following detailed description.

BRIEF DESCRIPTION OF DRAWINGS

FIG. 13 shows an exemplary flow diagram according to one aspect of the present embodiments.

DESCRIPTION

Figure 1:
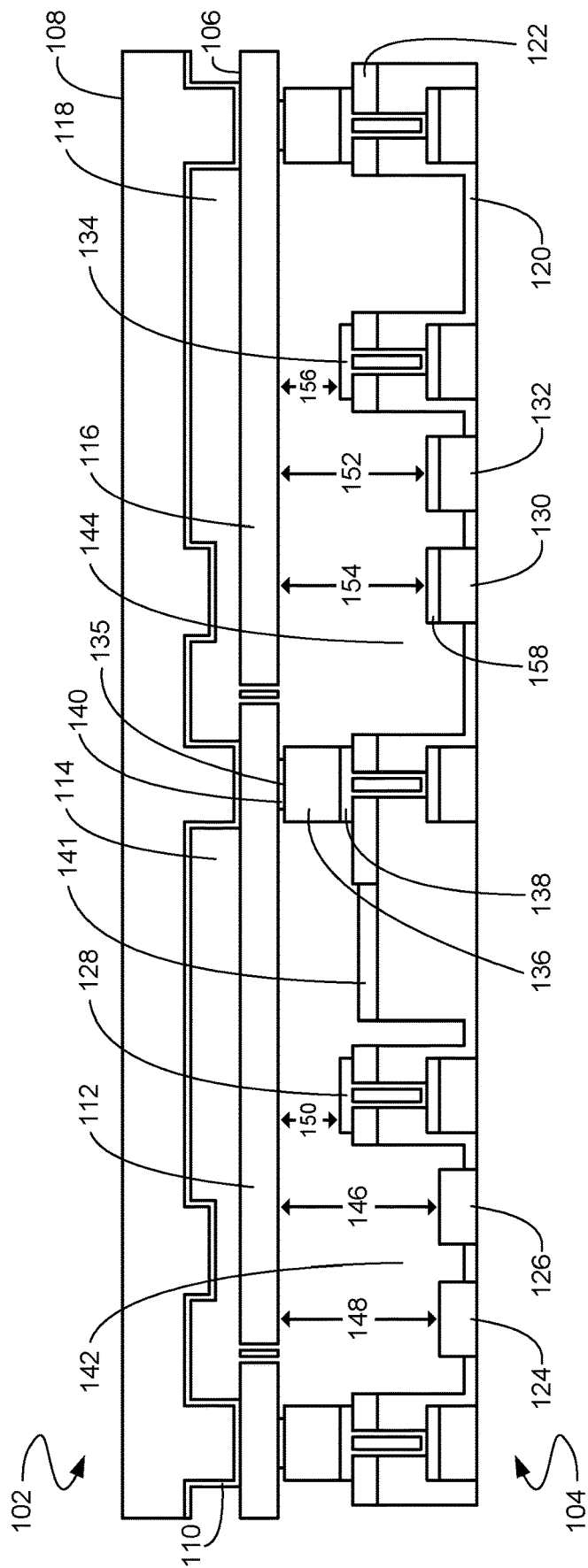
FIG. 1 shows a MEMS wafer eutecticly bonded to a CMOS wafer according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS device includes mechanical elements and may optionally include electronics (e.g. electronics for sensing). MEMS devices include but are not limited to, for example, gyroscopes, accelerometers, magnetometers, pressure sensors, etc. During fabrication, it may be desirable to create various different MEMS devices on the same wafer. As technology advances, it is desirable to reduce the size of the MEMS devices, thereby resulting in die size reduction. According to embodiments described herein, the standoff features typically located at the eutectic bonding areas on the device layer of the MEMS wafer have been eliminated or the height of the standoff features greatly reduced. The PR topography around the standoff limits the placement of the critical features. Smaller standoffs enable placement of critical features closer to standoffs there by reducing the size of the die. As such, critical actuator features in the MEMS wafer can be placed closer to the bonding areas, thereby resulting in a reduction of the die size. Critical actuator features in the device layer of the MEMS wafer include, for example, in-plane bump stop, in-plane sensing electrode, and damper. It is understood that these critical actuator features are merely exemplary and other critical features are within the scope of the embodiments described herein.

Referring now to FIG. 1, a MEMS wafer 102 eutecticly bonded to a CMOS wafer 104 is shown according to one aspect of the present embodiments. The MEMS wafer 102 includes a device layer 106 and a handle substrate 108 that are bonded together, for example with a fusion bond 110. The MEMS wafer 102 may include a first MEMS device 112 (e.g. an accelerometer) with a corresponding first MEMS cavity 114 (e.g. an accelerometer cavity). The MEMS wafer 102 may also include one or more additional MEMS devices, such as a second MEMS device 116 (e.g. a gyroscope) with a corresponding second MEMS cavity 118 (e.g. a gyroscope cavity). It is understood that the first MEMS device 112 and the second MEMS device 116 may be the same or different devices, and the MEMS devices may include any MEMS device (e.g. gyroscopes, accelerometers, magnetometers, pressure sensors, etc.).

The CMOS wafer 104 may include an oxide layer 120 and a passivation layer 122 overlying the oxide layer 120. The CMOS wafer 104 may also include a shield electrode 124, a sensing electrode 126, and/or a bump stop electrode 128 corresponding to the first MEMS device 112. In addition, the CMOS wafer 104 may include a shield electrode 130, a sensing electrode 132, and/or a bump stop electrode 134 corresponding to the second MEMS device 116. It is understood that various embodiments may include one or more of the electrodes 124, 126, 128, 130, 132 and/or 134, and that not all the electrodes may be present in every embodiment. In addition, it is understood that various embodiments may include the electrodes 124, 126, 128, 130, 132 and/or 134 in various combinations (e.g. the bump stop electrode 128 may be between the shield electrode 124 and the sensing electrode 126, the shield electrode 124 may be between the bump stop electrode 128 and the sensing electrode 126, the sensing electrode 126 may be between the shield electrode 124 and the bump stop electrode 128, etc.).

The MEMS wafer 102 and the CMOS wafer 104 are connected by a eutectic bond 135 between a first bonding metal 136 on a bonding electrode 138 of the CMOS wafer 104 and a second bonding metal 140 on the device layer 106 of the MEMS wafer 102. In various embodiments the eutectic bond 135 hermetically seals a MEMS device (e.g. first MEMS device 112, second MEMS device 116, and/or others) and may separate one MEMS device from another MEMS device (e.g. as illustrated the eutectic bond 135 separates the first MEMS device 112 from the second MEMS device 116). In some embodiments, with the first MEMS device 112, an outgassing region 141 is within the passivation layer 122 and overlies a portion of the oxide layer 120.

In various embodiments, the MEMS wafer 102 does not include a standoff on the device layer 106 for the second bonding metal 140. In some embodiments (not shown), the MEMS wafer 102 includes a small standoff (smaller than the standard standoff). As a result, critical features (e.g. in-plane bump stop, in-plane sensing electrode, damper, spring, etc.) can be placed much closer to the eutectic bond 135 due to lesser amounts (or no amount) of photoresist buildup caused by larger standoffs.

However, in order to maintain desirable gap ranges, one or more of the electrodes 124, 126, 128, 130, 132 and/or 134 may be formed in one or more cavities in the oxide layer 120. For example, shield electrode 124 and sensing electrode 126 may be within a first cavity 142 in the oxide layer 120 corresponding to the first MEMS device 112. In addition, shield electrode 130 and sensing electrode 132 may be within a second cavity 144 in the oxide layer 120 corresponding to the second MEMS device 116.

As such, the cavities 142 and 144 in the oxide layer 120 allow one or more of the electrodes to be further away from the device layer 106. For example, with the first MEMS device 112, the sensing electrode 126 is separated from the device layer 106 by a sensing gap 146, the shield electrode 124 is separated from the device layer 106 by a shield gap 148, and the bump stop electrode 128 is separated from the device layer 106 by a bump stop gap 150. It is understood that the sensing gap 146 is the distance between the sensing electrode 126 and the device layer 106 (e.g. proof mass) of the first MEMS device 112. In addition, the shield gap 148 is the distance between the shield electrode 124 and the device layer 106 (e.g. proof mass) of the MEMS device. The shield electrode 124 is used to apply a voltage similar to the proof mass voltage in order to keep the device from drifting. In various embodiments, the sensing gap 146 and/or the shield gap 148 are greater than the bump stop gap 150. It is understood that the sensing gap 146 may also be greater than, equal to, or smaller than the shield gap 148.

Likewise, with the second MEMS device 116, the sensing electrode 132 is separated from the device layer 106 by a sensing gap 152, the shield electrode 130 is separated from the device layer 106 by a shield gap 154, and the bump stop electrode 134 is separated from the device layer 106 by a bump stop gap 156. In some embodiments, a getter layer 158 overlies the sensing electrode 132 and/or the shield electrode 130. In various embodiments, the sensing gap 152 and/or the shield gap 154 are greater than the bump stop gap 156. It is understood that the sensing gap 152 may also be greater than, equal to, or smaller than the shield gap 154.

Therefore, in the embodiments described, a nominal vertical gap (e.g. the sensing gap 146) is defined by a bonding height (e.g. the first bonding metal 136) and a passivation stack height (e.g. the passivation layer 122). In addition, a smaller vertical gap (e.g. the bump stop gap 150) is defined by the bonding height (e.g. the first bonding metal 136). The smaller vertical gap is lesser (e.g. smaller/shorter) than the nominal vertical gap.

Figure 2:
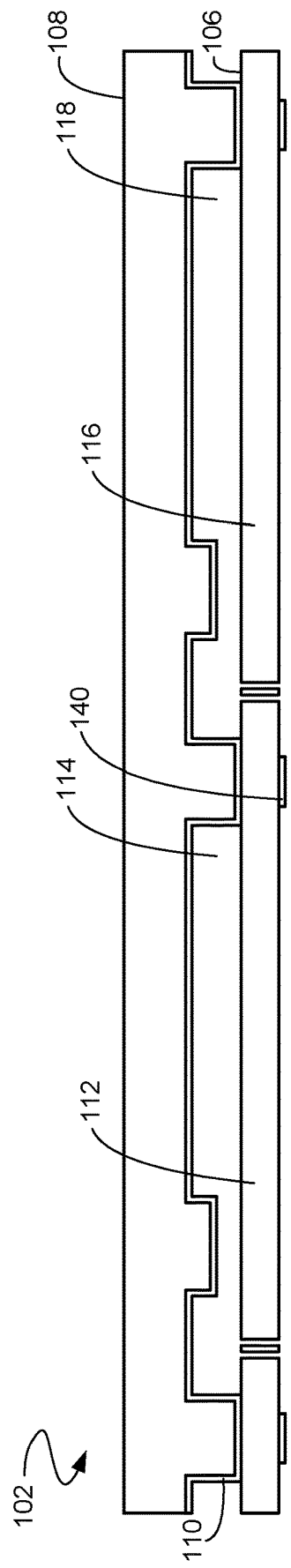
FIG. 2 shows the MEMS wafer before eutectic bonding according to one aspect of the present embodiments.

Referring now to FIG. 2, the MEMS wafer 102 before eutectic bonding is shown according to one aspect of the present embodiments. The first MEMS cavity 114 and the second MEMS cavity 118 have been patterned in the handle substrate 108, and the first MEMS device 112 and the second MEMS device 116 have been patterned in the device layer 106. Fusion bond oxide has been deposited, forming the fusion bond 110 that connects the handle substrate 108 to the device layer 106. As illustrated, standoff patterning has been skipped on the bottom of the device layer 106, and Ge has been deposited and patterned, forming the second bonding metal 140. It is understood that other metals that can form the eutectic bond 135 (FIG. 1) with the first bonding metal 136 (FIG. 1) may also be used. As previously discussed, some embodiments (not shown) may include patterning for small standoffs (smaller than the standard standoff).

Figure 3:
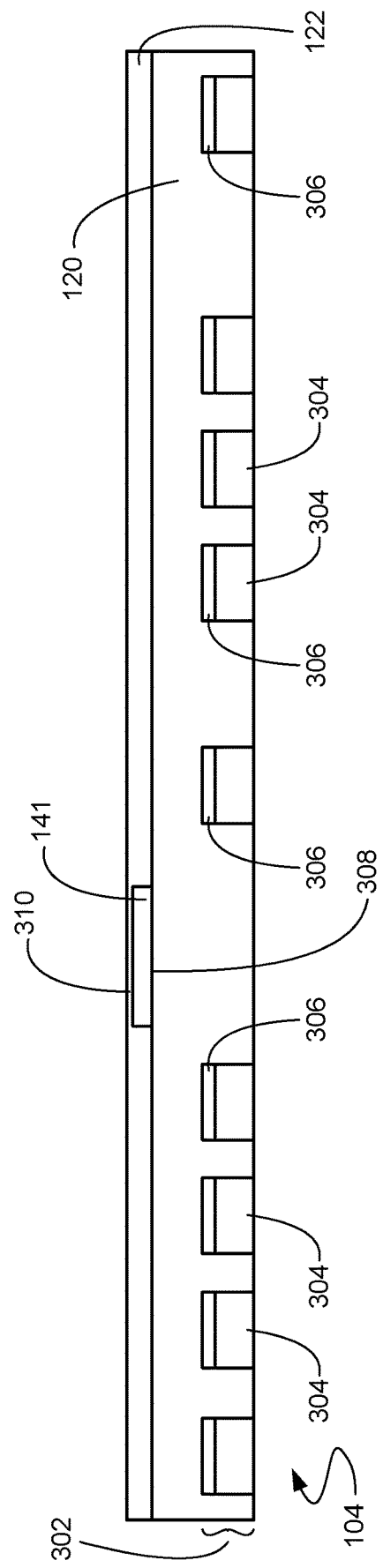
FIG. 3 shows the CMOS wafer before eutectic bonding according to one aspect of the present embodiments.

Referring now to FIG. 3, the CMOS wafer 104 before eutectic bonding is shown according to one aspect of the present embodiments. A metal layer 302 has been deposited and patterned. In various embodiments the metal layer 302 may include one or more layers (e.g. a AlCu layer 304 and an overlying Ti layer 306).

At this stage of manufacture the oxide layer 120 surrounds and overlies the metal layer 302. In addition, the outgassing region 141 overlies a portion 308 of the oxide layer 120. The outgassing region may include, for example, high density plasma ("HDP") oxide, and may be referred to as an HDP module. Furthermore, the passivation layer 122 overlies the oxide layer 120 and the outgassing region 141, thereby forming a barrier layer 310 overlying the outgassing region 141. The barrier layer 310 seals the outgassing region 141 and will be removed in later steps.

In various embodiments, the passivation layer 122 may include one or more layers. For example, the passivation layer 122 may include a SiN layer and/or a silicon rich oxide ("SRO") layer. In various embodiments, a portion of the passivation layer 122 overlies the outgassing region 141, thereby forming the barrier layer 310.

Figure 4:
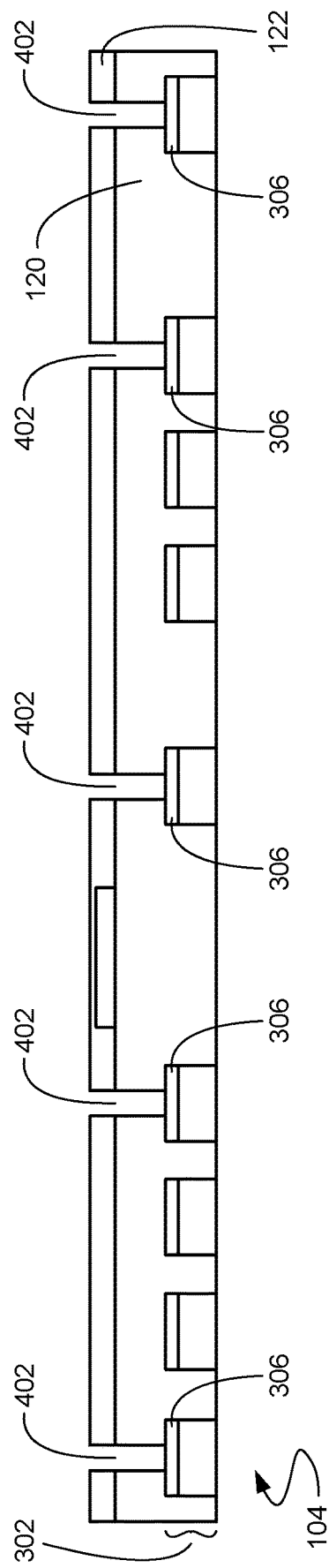
FIG. 4 shows the CMOS wafer including vias according to one aspect of the present embodiments.

Referring now to FIG. 4, the CMOS wafer 104 including vias 402 is shown according to one aspect of the present embodiments. Vias 402 have been formed (e.g. etched) in the passivation layer 122 and the oxide layer 120. The vias 402 are trenches that expose a portion of the metal layer 302 corresponding to one or more of the electrodes 124, 126, 128, 130, 132. 134, and/or 138 (FIG. 1). In the illustrated embodiment, the vias 402 expose the Ti layer 306 corresponding to the bonding electrodes 138 (FIG. 1) and the bump stop electrodes 128 and 134 (FIG. 1).

Figure 5:
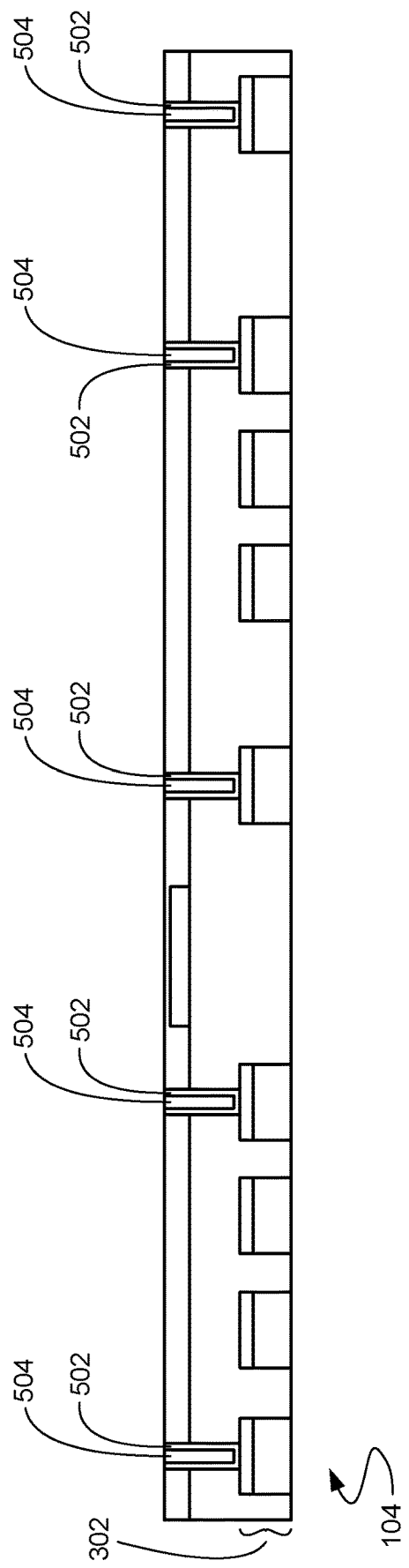
FIG. 5 shows the CMOS wafer after the vias have been filled according to one aspect of the present embodiments.

Referring now to FIG. 5, the CMOS wafer 104 after the vias 402 (FIG. 4) have been filled is shown according to one aspect of the present embodiments. The vias 402 (FIG. 4) have had their trenches coated with a liner 502. For example, TiN may be used to line the trenches under the electrodes 124, 126, 128, 130, 132. 134, and/or 138 (FIG. 1). In the illustrated embodiment, the TiN lined trenches are under the electrodes corresponding to the bonding electrodes 138 (FIG. 1) and the bump stop electrodes 128 and 134 (FIG. 1).

The lined trenches are then filled, thereby forming a connection between the corresponding electrode and metal layer 302. For example, tungsten vias 504 connect the bonding electrodes 138 (FIG. 1) and the bump stop electrodes 128 and 134 (FIG. 1) to corresponding metal layers 302. In various embodiments, the bump stop electrodes 128 and 134 (FIG. 1) include TiN or tungsten.

Figure 7A:
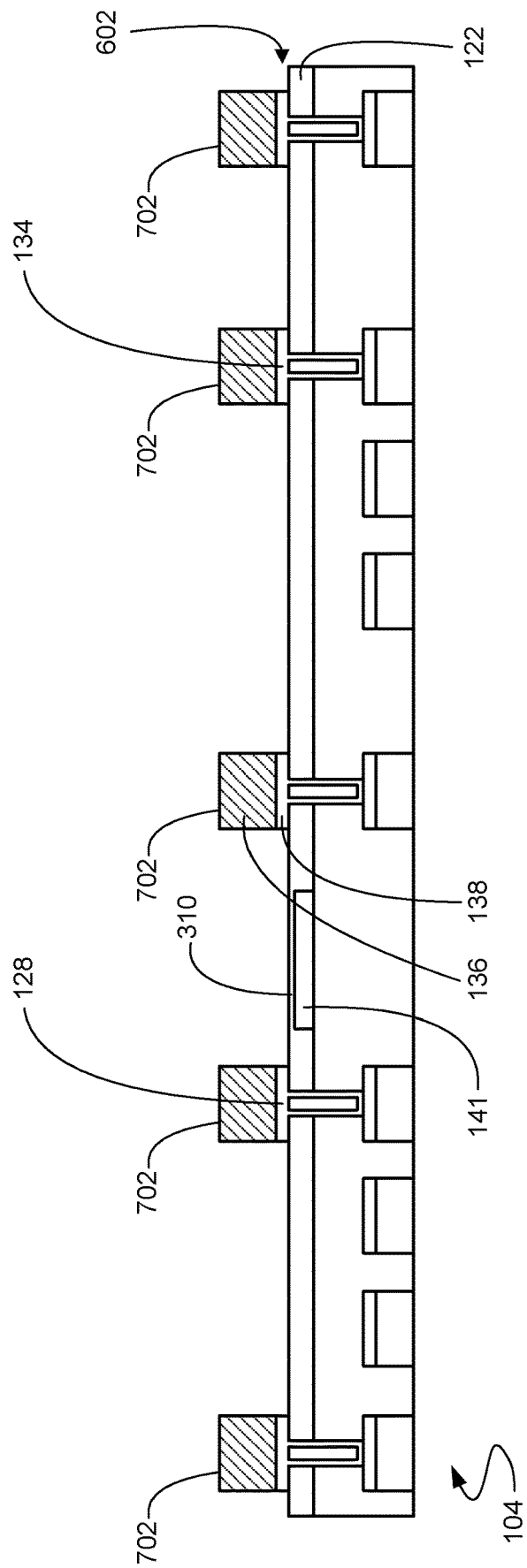
FIG. 7A shows Process B of the CMOS wafer after electrode deposition and patterning according to one aspect of the present embodiments.
Figure 7B:
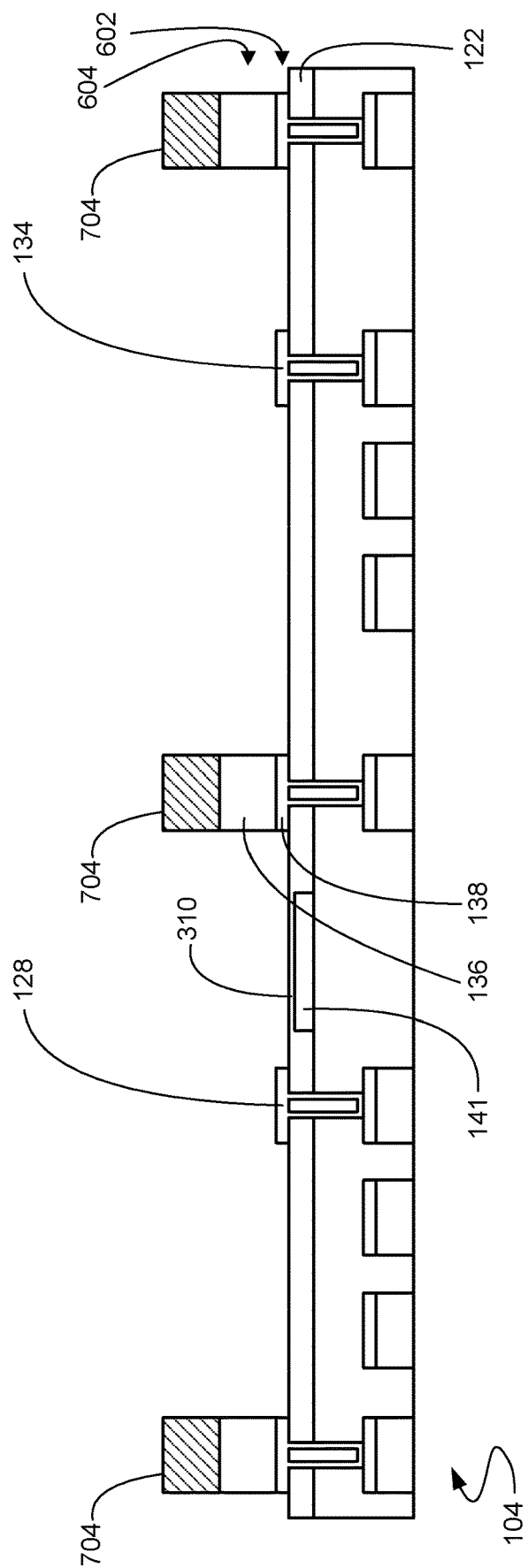
FIG. 7B shows Process B of the CMOS wafer after bonding layer deposition and patterning according to one aspect of the present embodiments.
Figure 7C:
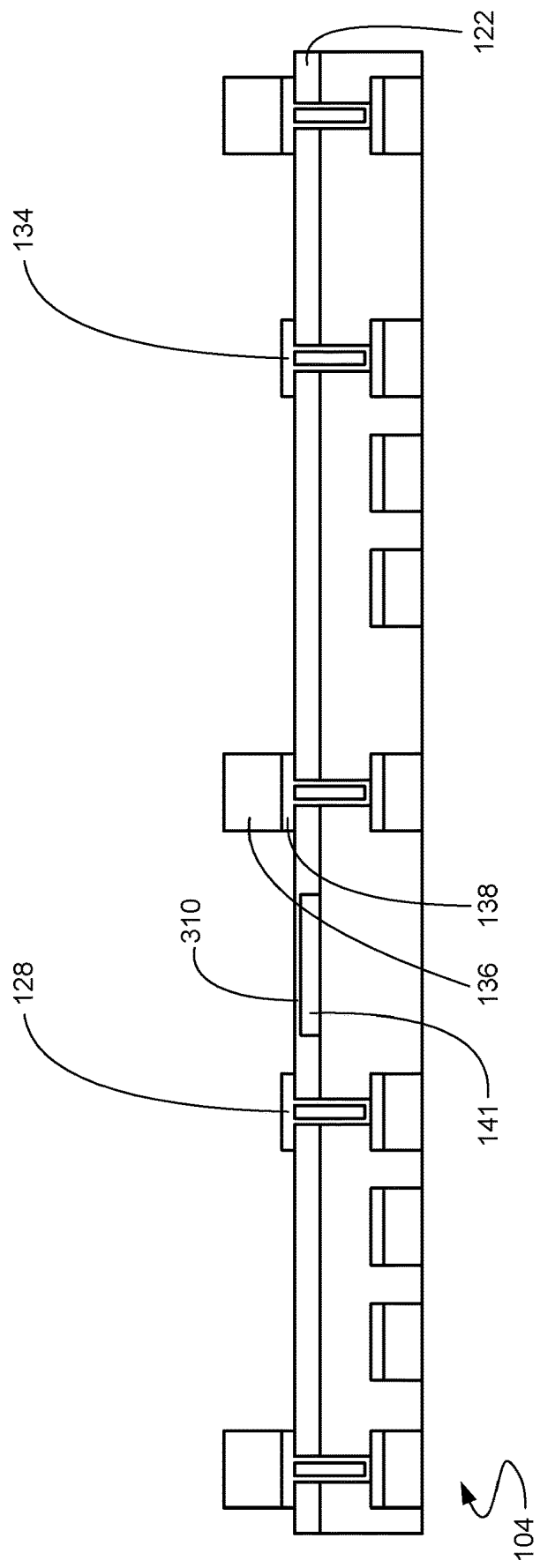
FIG. 7C shows Process B of the CMOS wafer after removal of the photoresist mask according to one aspect of the present embodiments.
Figure 8A:
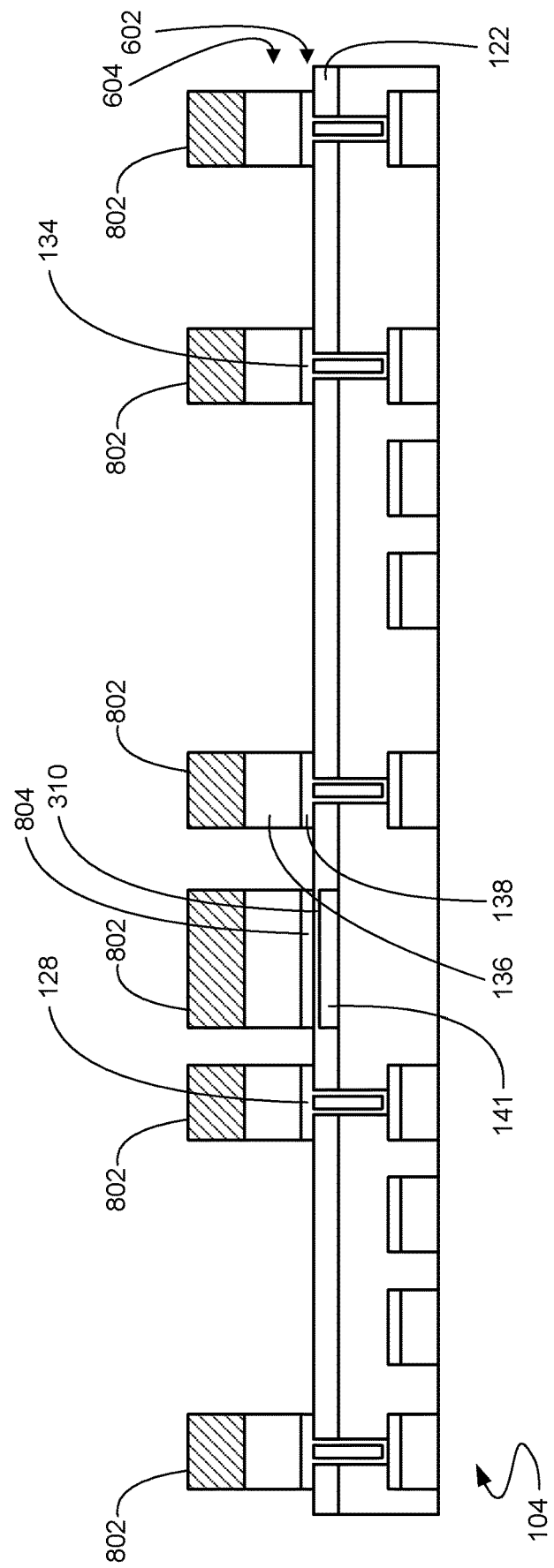
FIG. 8A shows Process C of the CMOS wafer after electrode deposition and patterning according to one aspect of the present embodiments.
Figure 8B:
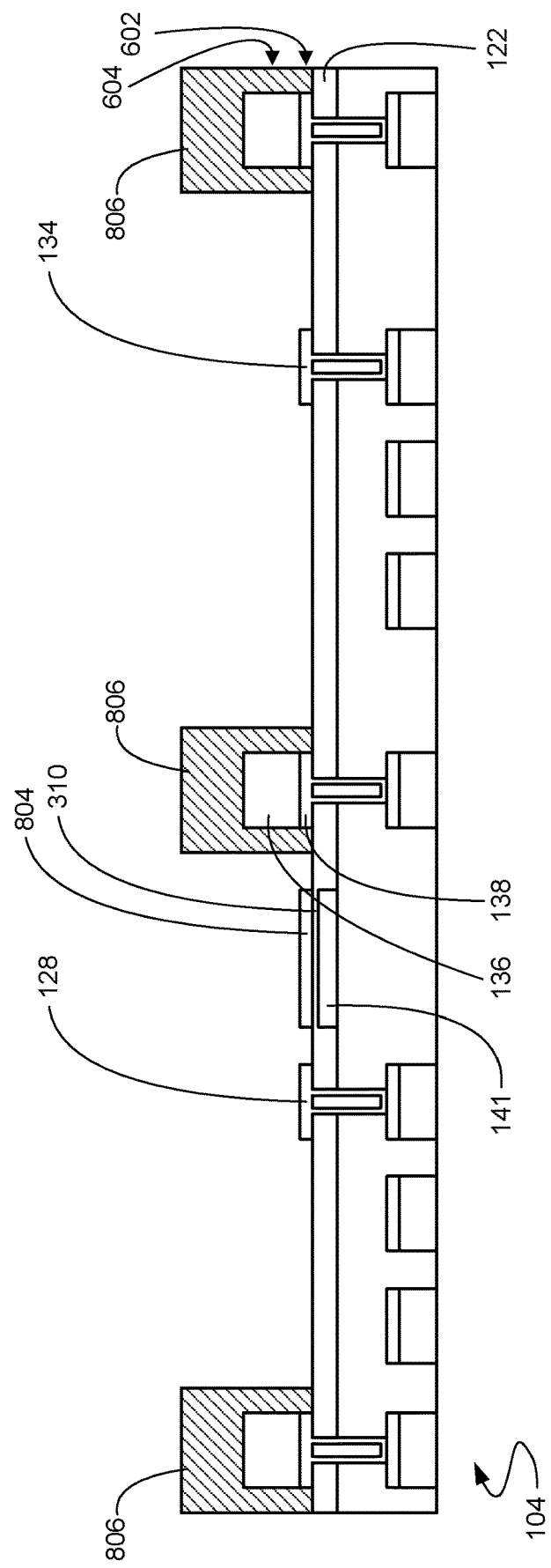
FIG. 8B shows Process C of the CMOS wafer after selective etch of the first bonding metal layer according to one aspect of the present embodiments.
Figure 8C:
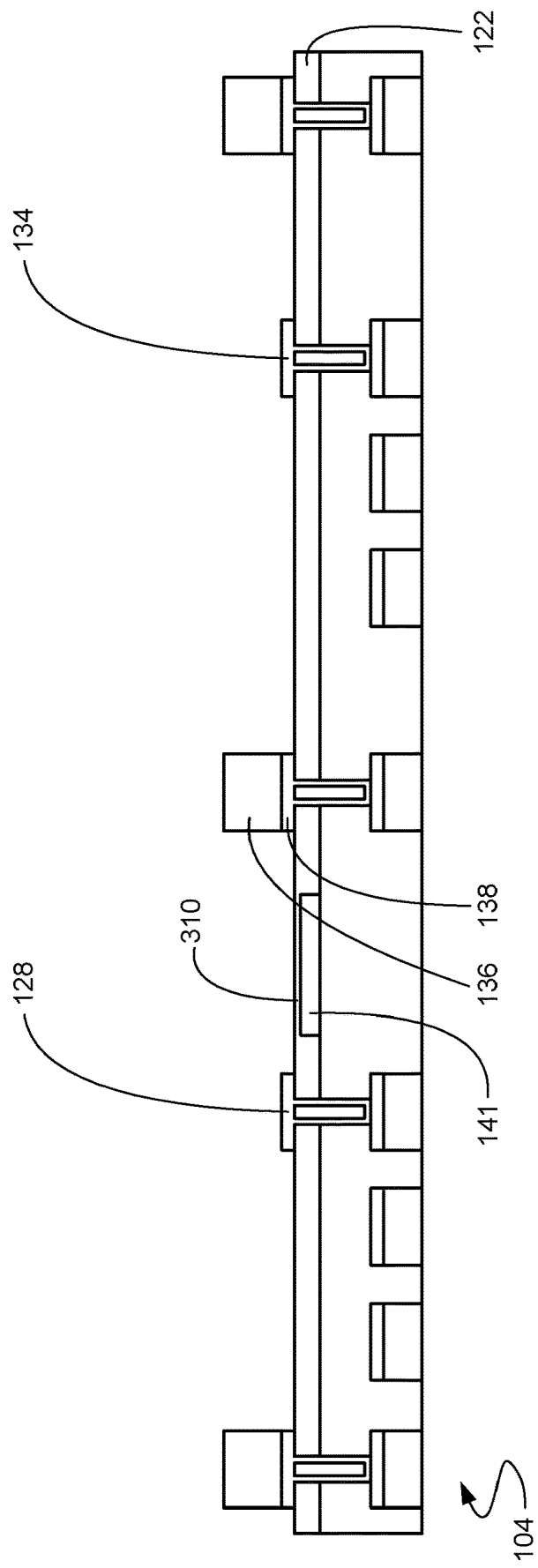
FIG. 8C shows Process C of the CMOS wafer after removal of the photoresist mask according to one aspect of the present embodiments.

After FIG. 5, the process may proceed through Process A (FIGS. 6A, 6B, & 6C), Process B (FIGS. 7A, 7B, & 7C), or Process C (FIGS. 8A, 8B, & 8C). Process A, B, and C will be described below, and it is understood that Process A, B, & C then continue with FIG. 9. For example, after FIG. 6C the process continues with FIG. 9. Likewise, after FIG. 7C the process continues with FIG. 9, and after FIG. 8C the process continues with FIG. 9.

Figure 6A:
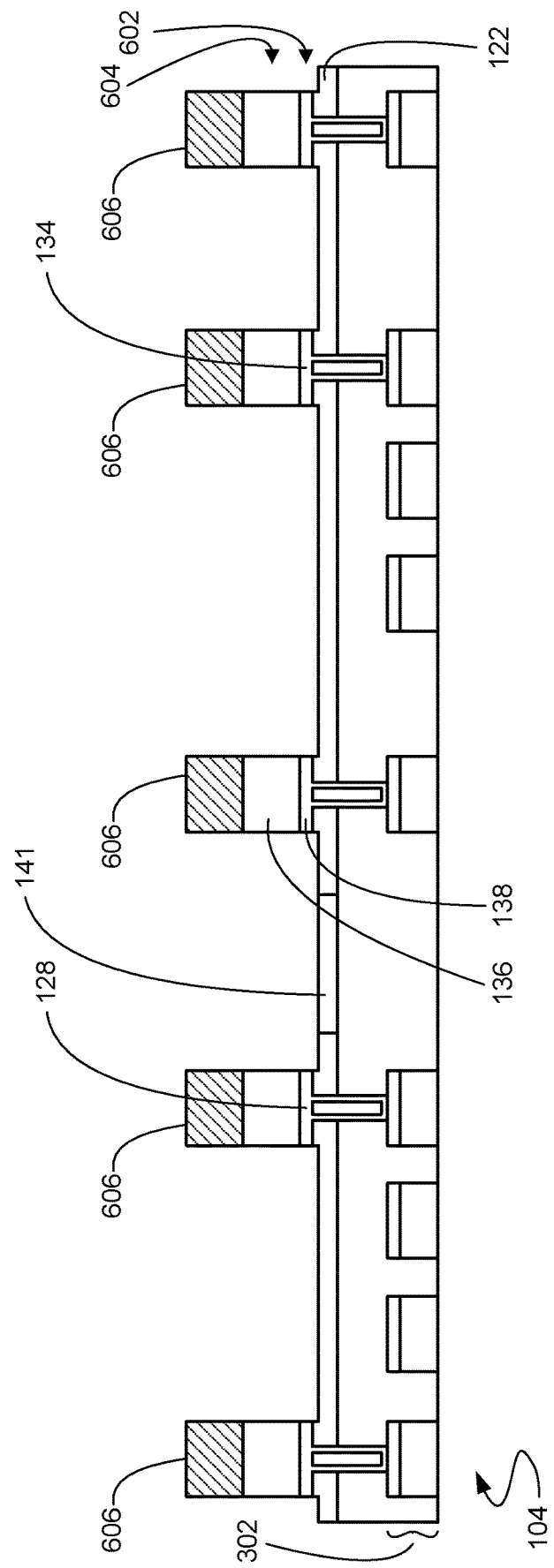
FIG. 6A shows Process A of the CMOS wafer after electrode deposition and patterning according to one aspect of the present embodiments.

Referring now to FIG. 6A, Process A of the CMOS wafer 104 after electrode deposition and patterning is shown according to one aspect of the present embodiments. An electrode layer 602 (e.g. TiN) and a first bonding metal layer 604 (e.g. AlCu) have been deposited overlying the passivation layer 122. The electrode layer 602 has been patterned using a photoresist mask 606, thereby forming the bump stop electrodes 128 and 134 and the bonding electrode 138. In addition, the first bonding metal layer 604 is patterned with the photoresist mask 606, leaving first bonding metal 136 over the electrodes 128, 134, and 138. In the illustrated embodiment, the patterning removes the barrier layer 310 (FIG. 3) over the outgassing region 141, thereby exposing the outgassing region 141. In other embodiments (not shown), the barrier layer 310 (FIG. 3) may remain at this point in Process A. In such embodiments, the thickness of the barrier layer 310 (FIG. 3) may be increased in earlier steps so that etching does not completely remove the layer. It is understood that other methods may also be used in conjunction with Process A in order to keep the barrier layer 310 (FIG. 3). In addition, the passivation layer 122 may experience etch loss beyond the barrier layer 310 (FIG. 3) as a result of the patterning.

Figure 6B:
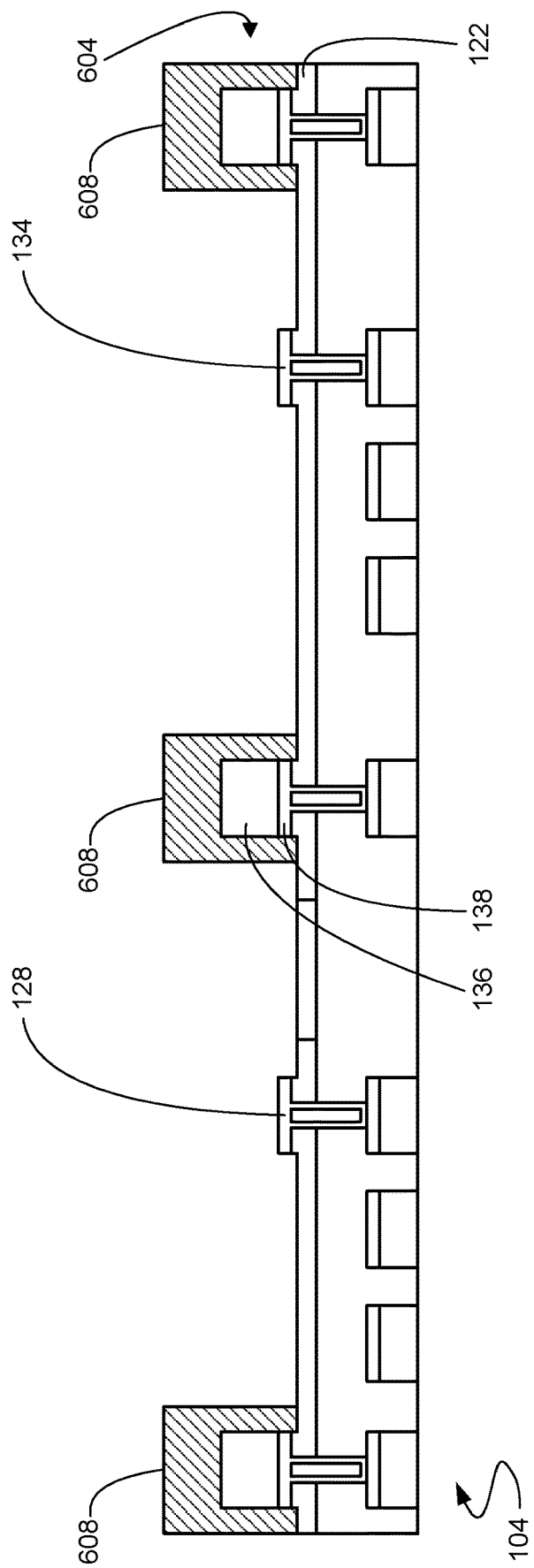
FIG. 6B shows Process A of the CMOS wafer after selective etch of the first bonding metal layer according to one aspect of the present embodiments.

Referring now to FIG. 6B, Process A of the CMOS wafer 104 after selective etch of the first bonding metal layer 604 is shown according to one aspect of the present embodiments. The first bonding layer 604 has been etched (e.g. wet etched) using another photoresist mask 608 to remove the first bonding metal 136 on the bump stop electrodes 128 and 134, thereby exposing the bump stop electrodes 128 and 134. As a result, the first bonding metal 136 remains overlying the bonding electrode 138. It is understood that in various embodiments, there may be more than one bonding electrode with overlying first bonding metal.

Figure 6C:
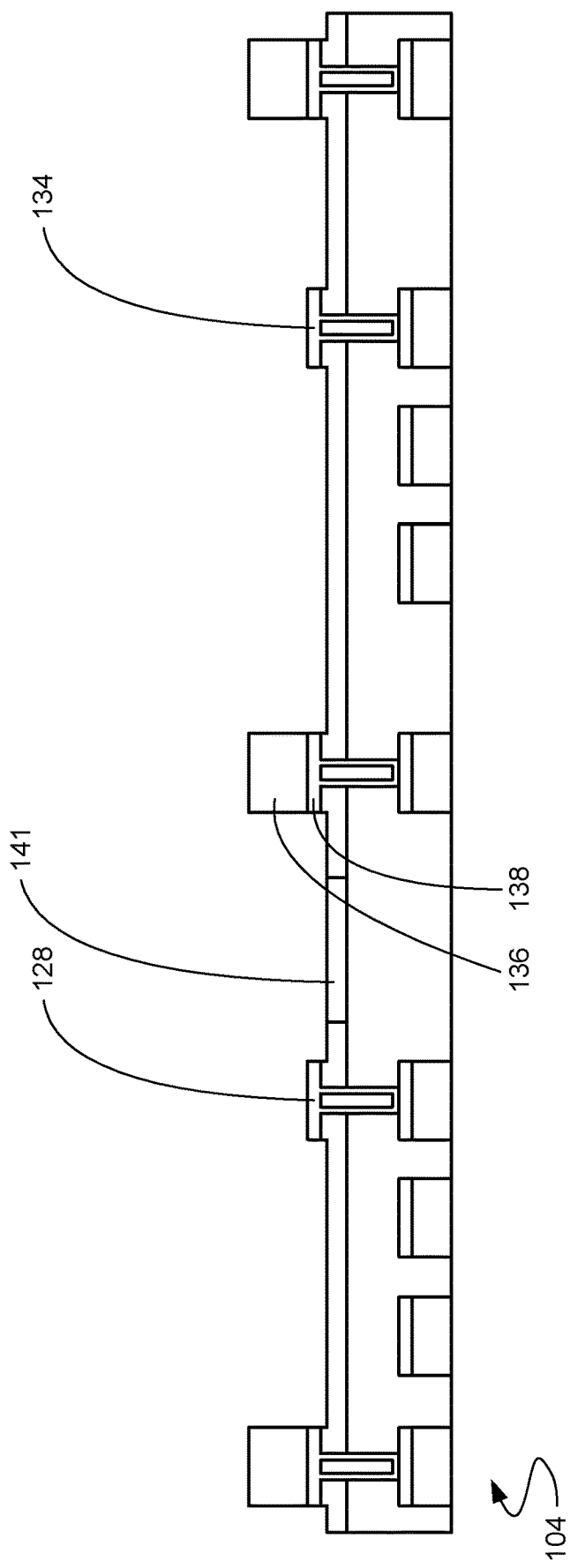
FIG. 6C shows Process A of the CMOS wafer after removal of the photoresist mask according to one aspect of the present embodiments.

Referring now to FIG. 6C, Process A of the CMOS wafer 104 after removal of the photoresist mask 608 (FIG. 6B) is shown according to one aspect of the present embodiments. The photoresist mask 608 (FIG. 6B) has been removed, thereby exposing the first bonding metal 136 overlying the bonding electrode 138. Likewise, the bump stop electrodes 128 and 134 are exposed. As a result, the CMOS wafer 104 is ready for further processing in FIG. 9.

Referring now to FIG. 7A, Process B of the CMOS wafer 104 after electrode deposition and patterning is shown according to one aspect of the present embodiments. The electrode layer 602 (e.g. TiN) has been deposited overlying the passivation layer 122. The electrode layer 602 has been patterned using a photoresist mask 702, thereby forming the bump stop electrodes 128 and 134 and the bonding electrode 138. In the illustrated embodiment, the patterning leaves the barrier layer 310 over the outgassing region 141, thereby keeping the outgassing region 141 sealed within the passivation layer 122.

Referring now to FIG. 7B, Process B of the CMOS wafer 104 after bonding layer deposition and patterning is shown according to one aspect of the present embodiments. The bonding layer 604 (e.g. AlCu) has been deposited and patterned using another photoresist mask 704 (e.g. using wet etch), thereby forming the first bonding metal 136 overlying the bonding electrode 138. In some embodiments, patterning the bonding layer using wet etch, results in an undercut etch (not shown in the figure). For example, in various embodiments the bonding layer 604 may be deposited over the passivation layer 122 and the electrodes 128, 134, and 138. Selective etch is then used with the photoresist mask 704 to remove the bonding layer 604 that is not protected by the photoresist mask 704, thereby leaving the first bonding metal 136 overlying the bonding electrode 138.

It is understood that one or more bonding metal overlying electrode combinations may be formed in various embodiments. In the illustrated embodiment, the patterning leaves the barrier layer 310 over the outgassing region 141, thereby keeping the outgassing region 141 sealed within the passivation layer 122. In addition, there is no bonding metal overlying the bump stop electrodes 128 and 134.

Referring now to FIG. 7C, Process B of the CMOS wafer 104 after removal of the photoresist mask 704 (FIG. 7B) is shown according to one aspect of the present embodiments. The photoresist mask 704 (FIG. 7B) has been removed, thereby exposing the first bonding metal 136 overlying the bonding electrode 138. Likewise, the bump stop electrodes 128 and 134 remain exposed. The barrier layer 310 remains over the outgassing region 141, thereby keeping the outgassing region 141 sealed within the passivation layer 122. As a result, the CMOS wafer 104 is ready for further processing in FIG. 9.

Referring now to FIG. 8A, Process C of the CMOS wafer 104 after electrode deposition and patterning is shown according to one aspect of the present embodiments. The electrode layer 602 (e.g. TiN) has been deposited overlying the passivation layer 122, and the first bonding metal layer 604 (e.g. AlCu) has been deposited overlying the electrode layer 602. The electrode layer 602 has been patterned using a photoresist mask 802, thereby forming the bump stop electrodes 128 and 134 and the bonding electrode 138. In addition, the first bonding metal layer 604 is patterned with the photoresist mask 802, leaving first bonding metal 136 over the electrodes 128, 134, and 138.

Furthermore, in the illustrated embodiment the patterning using the photoresist mask 802 leaves a portion of the electrode layer 602 (e.g. a protective region 804) over the barrier layer 310 and the outgassing region 141. In addition, the first bonding metal layer 604 overlies the protective region 804. As a result, the outgassing region 141 remains sealed within the passivation layer 122. Therefore, the first bonding metal 136 remains on the protective region 804, as well as the electrodes 128, 134, and 138, after the patterning. In an alternate embodiment, protecting the passivation layer outside the seal ring can be done by leaving the bonding metal layer 604 during the patterning step.

Referring now to FIG. 8B, Process C of the CMOS wafer 104 after selective etch of the first bonding metal layer 604 is shown according to one aspect of the present embodiments. The first bonding layer 604 has been etched (e.g. wet etched) using another photoresist mask 806 to remove the first bonding metal 136 on the bump stop electrodes 128 and 134 and the protective region 804, thereby exposing the bump stop electrodes 128 and 134 and the protective region 804. As a result, the first bonding metal 136 remains overlying the bonding electrode 138. It is understood that in various embodiments, there may be more than one bonding electrode with overlying first bonding metal. Furthermore, the protective region 804 remains over the barrier layer 310 and the outgassing region 141. As a result, the outgassing region 141 remains sealed within the passivation layer 122.

Referring now to FIG. 8C, Process C of the CMOS wafer 104 after removal of the photoresist mask 806 (FIG. 8B) is shown according to one aspect of the present embodiments. The photoresist mask 806 (FIG. 8B) has been removed, thereby exposing the first bonding metal 136 overlying the bonding electrode 138. Likewise, the bump stop electrodes 128 and 134 remain exposed. In addition, the protective region 804 has been removed (e.g. by etching), thereby leaving the barrier layer 310 remaining over the outgassing region 141. As a result, the outgassing region 141 remains covered by the portion of the passivation layer (e.g. the barrier layer 310) and sealed within the passivation layer 122. Therefore, the CMOS wafer 104 is ready for further processing in FIG. 9.

Figure 9:
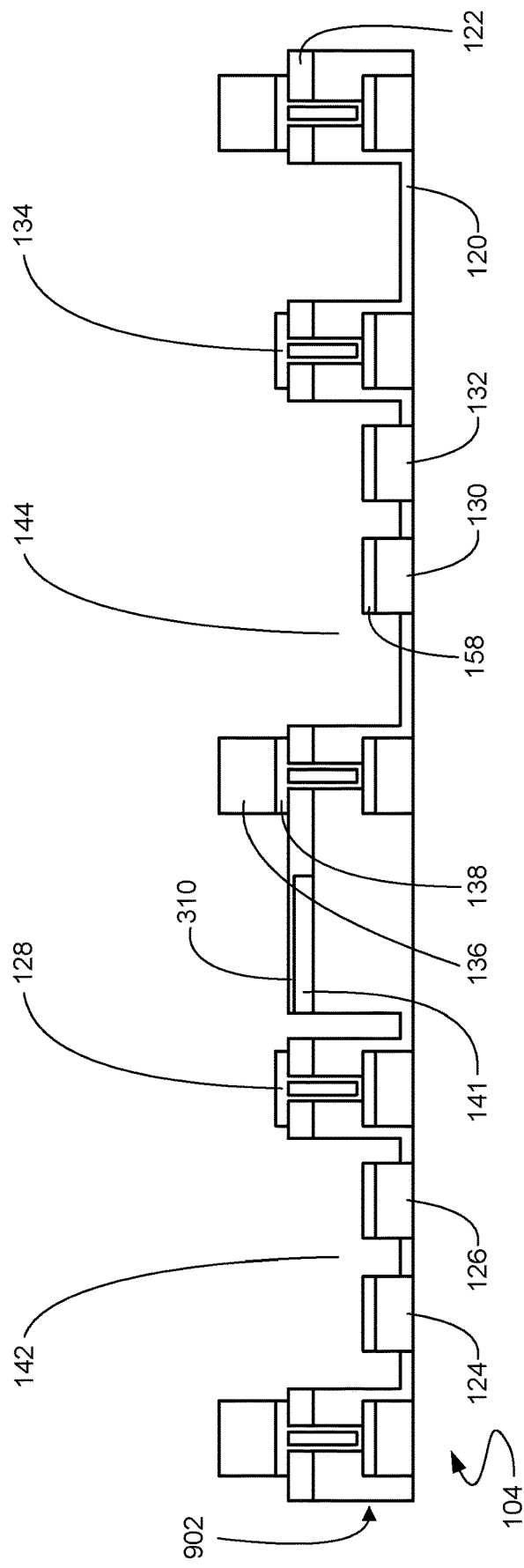
FIG. 9 shows the CMOS wafer after passivation etch according to one aspect of the present embodiments.

Referring now to FIG. 9, the CMOS wafer 104 after passivation etch is shown according to one aspect of the present embodiments. The passivation layer 122 has been etched (e.g. with a mask), thereby forming the first cavity 142 and the second cavity 144. It is understood that in various embodiments more cavities may be formed. Therefore, the etching exposes the shield electrode 124 adjacent to the sensing electrode 126 in the first cavity 142. In addition, the etching exposes the shield electrode 130 adjacent to the sensing electrode 132 in the second cavity 144.

Therefore, for example, the bonding electrode 138 and the bump stop electrode 128 overly the passivation layer 122. The shield electrode 124 and the sensing electrode 126 are positioned adjacent to the bump stop electrode 128 and the bonding electrode 138. However, the shield electrode 124 and the sensing electrode 126 do not overly the passivation layer 122. Instead the shield electrode 124 and the sensing electrode 126 are in the first cavity 142 in the oxide layer 120 that was formed by removing a portion of the passivation layer 122 and the oxide layer 120. As such, the shield electrode 124 and the sensing electrode 126 are lower than the passivation layer 122, the bump stop electrode 128, and the bonding electrode 138.

At this point, metal layer 902 (e.g. Ti) is also exposed overlying the electrodes 124, 126, 130, and 132. It is understood, that in places where the metal layer 902 remains exposed, it acts as a getter layer (e.g. the getter layer 158). Therefore, in various embodiments the shield electrode 130 and/or the sensing electrode 132 include an overlying getter layer 158. In various embodiments, the electrodes 124, 126, 130, and 132 may be any conductive metal or composition (e.g. AlCu). The barrier layer 310 remains over the outgassing region 141 (except in embodiments following Process A, where the barrier layer 310 was previously removed). As a result, the outgassing region 141 remains sealed within the passivation layer 122.

Figure 10:
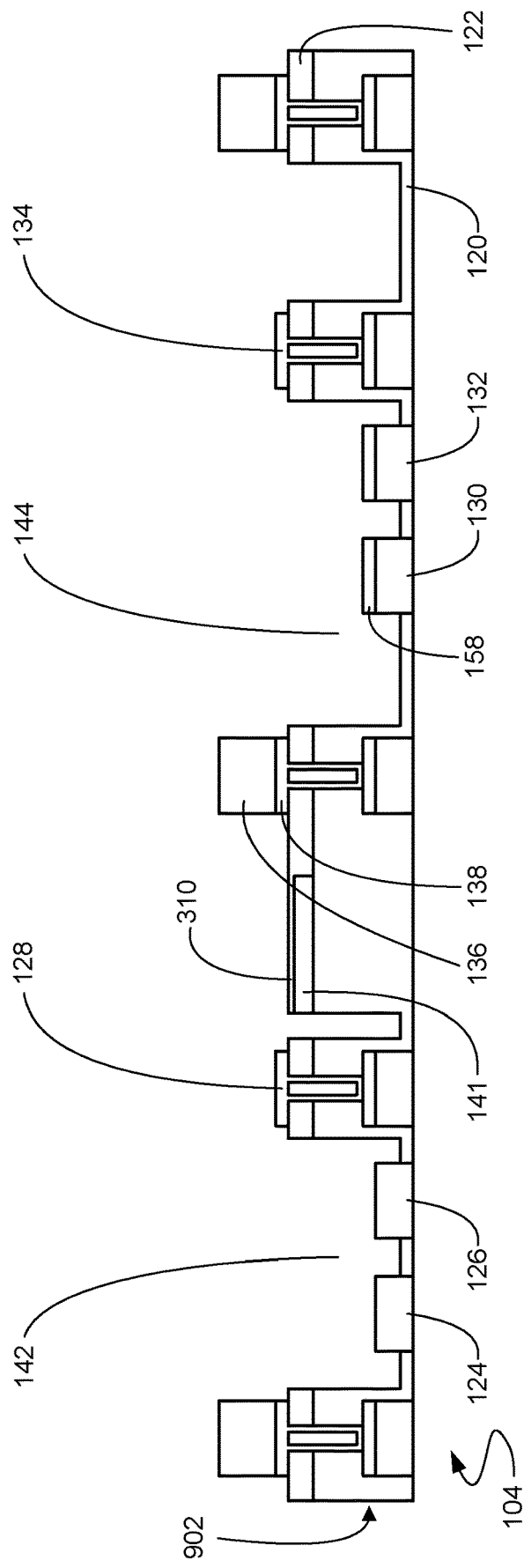
FIG. 10 shows the CMOS wafer after selective electrode layer etch according to one aspect of the present embodiments.

Referring now to FIG. 10, the CMOS wafer 104 after selective electrode layer etch is shown according to one aspect of the present embodiments. The electrode layer 902 overlying the shield electrode 124 and the sensing electrode 126 in the first cavity 142 has been selectively removed. As a result, the shield electrode 124 and the sensing electrode 126 in the first cavity 142 do not include a getter layer. However, the getter layer 158 remains on the shield electrode 130 and the sensing electrode 132 in the second cavity 144. The barrier layer 310 remains over the outgassing region 141 (except in embodiments following Process A, where the barrier layer 310 was previously removed). As a result, the outgassing region 141 remains sealed within the passivation layer 122.

Figure 11:
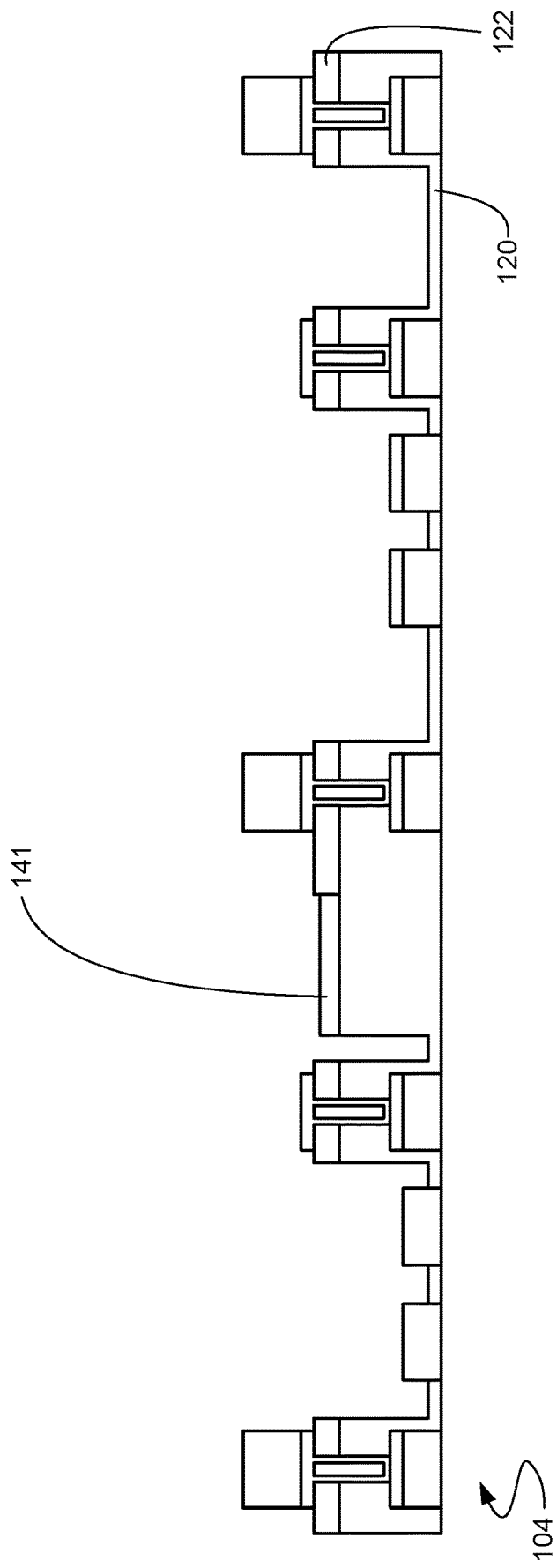
FIG. 11 shows the CMOS wafer after removal of the barrier layer according to one aspect of the present embodiments.

Referring now to FIG. 11, the CMOS wafer 104 after removal of the barrier layer 310 is shown according to one aspect of the present embodiments (except in embodiments following Process A, where the barrier layer 310 was previously removed). The barrier layer 310 (FIG. 10) (e.g. a portion of the passivation layer 122) has been removed, thereby exposing the outgassing region 141 that overlies the oxide layer 120. As a result, the outgassing region 141 remains in the passivation layer 122 but is no longer sealed within the passivation layer 122. In various embodiments, an alloy step (not shown) may be performed before the outgassing barrier layer etch.

Figure 12:
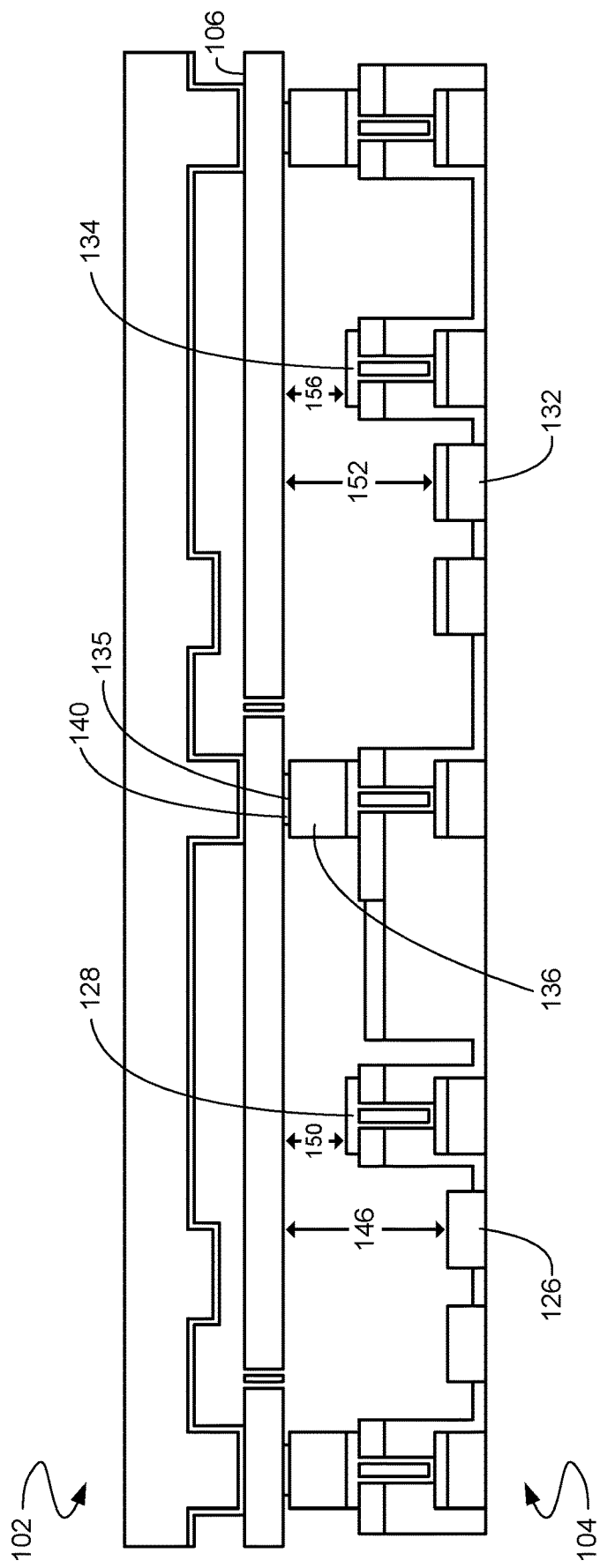
FIG. 12 shows the CMOS wafer and the MEMS wafer after eutectic bonding according to one aspect of the present embodiments.

Referring now to FIG. 12, the CMOS wafer 104 and the MEMS wafer 102 after eutectic bonding are shown according to one aspect of the present embodiments. The MEMS wafer 102 and the CMOS wafer 104 are connected by the eutectic bond 135 between the first bonding metal 136 and the second bonding metal 140. The eutectic bonding forms the sensing gaps 146 and 152 positioned between the corresponding sensing electrodes 126 and 132 and the device layer 106. In addition, the eutectic bonding forms the bump stop gaps 150 and 156 positioned between the corresponding bump stop electrodes 128 and 134 and the device layer 106. According to embodiments described herein, the sensing gap 146 is greater than the bump stop gap 150, and the sensing gap 152 is greater than the bump stop gap 156.

FIG. 13 shows an exemplary flow diagram according to one aspect of the present embodiments. At block 1302, a MEMS wafer including a device layer and a handle substrate bonded to the device layer is formed. At block 1304, a CMOS wafer including an oxide layer, and a passivation layer overlying the oxide layer is formed. At block 1306, a bonding electrode overlying the passivation layer and a bump stop electrode overlying the passivation layer is formed. At block 1308, the passivation layer and the oxide layer are etched, wherein the etching exposes a sensing electrode positioned between the bump stop electrode and the bonding electrode.

At block 1310, the MEMS wafer is euctecticly bonded to the CMOS wafer. The eutectic bonding includes forming a eutectic bond between a first bonding metal on the bonding electrode and a second bonding metal on the MEMS wafer. Furthermore, the eutectic bonding forms a sensing gap between the sensing electrode and the device layer. In addition, the sensing gap is greater than a bump stop gap positioned between the bump stop electrode and the device layer.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
    a micro-electro-mechanical system ("MEMS") wafer including a device layer and a handle substrate bonded to the device layer;
    a complementary metal-oxide semiconductor ("CMOS") wafer including an oxide layer, and a passivation layer overlying the oxide layer;
    a bonding electrode overlying the passivation layer and a bump stop electrode overlying the passivation layer;
    a eutectic bond between a first bonding metal on the bonding electrode and a second bonding metal on the MEMS wafer;
    a sensing electrode positioned adjacent to the bump stop electrode and the bonding electrode; and
    a sensing gap positioned between the sensing electrode and the device layer, wherein the sensing gap is greater than a bump stop gap positioned between the bump stop electrode and the device layer.

2. The apparatus of claim 1, further comprising an outgassing region over a portion of the oxide layer.

3. The apparatus of claim 2, wherein the outgassing region includes high density plasma ("HDP") oxide.

4. The apparatus of claim 1, wherein the sensing electrode includes a getter layer.

5. The apparatus of claim 1, further comprising a shield electrode adjacent to the sensing electrode.

6. The apparatus of claim 1, wherein the sensing electrode includes Al.

7. The apparatus of claim 1, wherein the first bonding metal includes Al and the second bonding metal includes Ge.

8. The apparatus of claim 1, wherein the bump stop electrode includes TiN or tungsten.

9. The apparatus of claim 1, wherein the sensing electrode is within a cavity in the oxide layer.

10. The apparatus of claim 1, further comprising a TiN lined trench under the bump stop electrode.

11. The apparatus of claim 1, further comprising a tungsten via connecting the bump stop electrode to a metal layer.

12. A method comprising:
    forming a micro-electro-mechanical system ("MEMS") wafer including a device layer and a handle substrate bonded to the device layer;
    forming a complementary metal-oxide semiconductor ("CMOS") wafer including an oxide layer, and a passivation layer overlying the oxide layer;
    forming a bonding electrode overlying the passivation layer and a bump stop electrode overlying the passivation layer;
    etching the passivation layer and the oxide layer, wherein the etching exposes a sensing electrode positioned between the bump stop electrode and the bonding electrode; and
    eutecticly bonding the MEMS wafer to the CMOS wafer, wherein
        the eutecticly bonding includes forming a eutectic bond between a first bonding metal on the bonding electrode and a second bonding metal on the MEMS wafer,
        the eutecticly bonding forms a sensing gap between the sensing electrode and the device layer, and
        the sensing gap is greater than a bump stop gap positioned between the bump stop electrode and the device layer.

13. The method of claim 12, wherein forming the bonding electrode overlying the oxide layer and the bump stop electrode overlying the passivation layer includes:

depositing an electrode layer overlying the passivation layer, depositing a bonding layer overlying the electrode layer, patterning the bonding layer and the electrode layer with a photoresist mask to form the bonding electrode and the bump stop electrode, wherein the first bonding metal remains on the bump stop electrode after the patterning, and the patterning exposes an outgassing region, and removing the first bonding metal on the bump stop electrode, wherein the removing exposes the bump stop electrode.

14. The method of claim 12, wherein forming the bonding electrode overlying the oxide layer and the bump stop electrode overlying the passivation layer includes:

depositing an electrode layer overlying the passivation layer, patterning the electrode layer with a photoresist mask to form the bonding electrode and the bump stop electrode, wherein an outgassing region remains covered by a portion of the passivation layer after the patterning the electrode layer, depositing a bonding layer overlying the passivation layer, the bonding electrode, and the bump stop electrode, patterning the bonding layer, wherein the first bonding metal remains on the bonding electrode after the patterning the bonding layer, and the outgassing region remains covered by the portion of the passivation layer after the patterning the bonding layer.

15. The method of claim 12, wherein forming the bonding electrode overlying the oxide layer and the bump stop electrode overlying the passivation layer includes:

depositing an electrode layer overlying the passivation layer, depositing a bonding layer overlying the electrode layer, patterning the bonding layer and the electrode layer with a photoresist mask to form the bonding electrode, the bump stop electrode, and a protective region over an outgassing region, wherein the first bonding metal remains on the bonding electrode, the bump stop electrode, and the protective region after the patterning, removing the first bonding metal on the bump stop electrode and the protective region, wherein the removing exposes the bump stop electrode and the protective region, removing the protective region, wherein the outgassing region remains covered by a portion of the passivation layer after the removing the protective region.

16. The method of claim 12, further comprising removing a portion of the passivation layer to expose an outgassing region.

17. The method of claim 12, wherein the sensing electrode includes a getter layer.

18. The method of claim 12, wherein the etching exposes a shield electrode adjacent to the sensing electrode.

19. The method of claim 12, further comprising forming a TiN lined trench under the bump stop electrode.

20. The method of claim 12, further comprising forming a tungsten via under the bump stop electrode.

* * * * *